(12) United States Patent
Liu

(10) Patent No.: US 9,601,389 B1
(45) Date of Patent: Mar. 21, 2017

(54) METHOD FOR LOCAL THINNING OF TOP SILICON LAYER OF SOI WAFER

(71) Applicant: Shanghai Huahong Grace Semiconductor Manufacturing Corporation, Shanghai (CN)

(72) Inventor: Zhangli Liu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 15/233,173

(22) Filed: Aug. 10, 2016

(30) Foreign Application Priority Data

Oct. 22, 2015 (CN) .......................... 2015 1 0694922

(51) Int. Cl.
*H01L 21/84* (2006.01)
*H01L 21/311* (2006.01)
*H01L 21/02* (2006.01)
*H01L 21/3205* (2006.01)
*H01L 21/321* (2006.01)

(52) U.S. Cl.
CPC ........ *H01L 21/84* (2013.01); *H01L 21/02164* (2013.01); *H01L 21/02238* (2013.01); *H01L 21/31111* (2013.01); *H01L 21/32055* (2013.01); *H01L 21/32105* (2013.01)

(58) Field of Classification Search
CPC ............... H01L 21/84; H01L 21/31111; H01L 21/02238; H01L 21/32055; H01L 21/32105; H01L 21/02164
See application file for complete search history.

(56) References Cited

U.S. PATENT DOCUMENTS

2004/0002197 A1* 1/2004 Fathimulla ........ H01L 21/76254
438/455

* cited by examiner

*Primary Examiner* — Kyoung Lee
(74) *Attorney, Agent, or Firm* — Muncy, Geissler, Olds & Lowe, P.C.

(57) ABSTRACT

A method for local thinning of a top silicon layer of a SOI wafer includes the consecutive steps of: providing a SOI wafer which successively includes a bottom silicon layer, a buried oxide layer and a top silicon layer; successively forming a silicon dioxide layer and a polysilicon layer over the top silicon layer; etching the silicon dioxide layer and the polysilicon layer until a top surface of the top silicon layer is exposed, such that a pattern is formed in the silicon dioxide layer and the polysilicon layer; oxidizing the silicon dioxide layer and the polysilicon layer and concurrently oxidizing the exposed portion of the top silicon layer until the polysilicon layer has been completely converted to an oxide, thereby forming a cap oxide layer; and removing the cap oxide layer, so that a locally thinned area is formed in the top surface of the top silicon layer.

9 Claims, 2 Drawing Sheets

METHOD FOR LOCAL THINNING OF TOP SILICON LAYER OF SOI WAFER

TECHNICAL FIELD

The present invention relates to the field of semiconductor device fabrication and, more particularly, to a method for local thinning of a top silicon layer of a silicon-on-insulator (SOI) wafer.

BACKGROUND

Figure of merit (FOM) is defined as the product of the on-resistance $R_{on}$ of a device and the parasitic capacitance $C_{off}$ of the device, i.e., FOM=$R_{on} \times C_{off}$. FOM measures the performance of a switching device or technique and is independent of the critical dimension of the device. In addition, the smaller the FOM, the higher the performance of the device.

Parasitic junction capacitance of a SOI device is related to the thickness of a top silicon layer of the SOI wafer from which the device is fabricated. Therefore, there is a need for a method for efficient and easy local thinning of a top silicon layer of a SOI wafer in order to form a SOI wafer structure with a locally thinned top silicon layer.

SUMMARY OF THE INVENTION

The problem to be solved by the present invention is to overcome the above shortcomings of the prior art by presenting a method capable of efficient and easy local thinning of a top silicon layer of a SOI wafer.

In order to achieve this objective, according to the present invention, a method for local thinning of a top silicon layer of a SOI wafer is provided, which includes the following steps in the sequence set forth: providing a silicon-on-insulator wafer, wherein the silicon-on-insulator wafer comprises a bottom silicon layer, a buried oxide layer and a top silicon layer, which are sequentially stacked from the bottom up; successively forming a silicon dioxide layer and a polysilicon layer over the top silicon layer; etching the silicon dioxide layer and the polysilicon layer until a top surface of a portion of the top silicon layer is exposed, such that a pattern that corresponds to an area to be locally thinned is formed in the silicon dioxide layer and the polysilicon layer; oxidizing the silicon dioxide layer and the polysilicon layer remaining from the etching step and concurrently oxidizing the exposed portion of the top silicon layer until the polysilicon layer has been completely converted to an oxide, thereby forming a cap oxide layer jointly constituted by the oxidized polysilicon layer, the silicon dioxide layer and the oxidized portion of the top silicon layer; and removing the cap oxide layer, so that a locally thinned area is formed in the top surface of the top silicon layer.

Preferably, the top silicon layer has a thickness of 1000 Å to 1450 Å.

Preferably, the silicon dioxide layer has a thickness of 100 Å.

Preferably, the polysilicon layer has a thickness that is determined by a thickness desired to be reduced by the local thinning.

Preferably, the polysilicon layer has a thickness of 450 Å.

Preferably, the top silicon layer has electronic circuits formed therein.

Preferably, the bottom silicon layer provides the top silicon layer and the buried oxide layer with a mechanical support.

Preferably, the buried oxide layer is a silicon dioxide layer.

Preferably, the polysilicon layer has a thickness smaller than a thickness of the top silicon layer.

A method for local thinning of a top silicon layer of a SOI wafer according to preferred embodiments of the present invention is compatible with CMOS and other conventional standard processes and can produce a locally thinned area with a good shape and a controlled thickness.

BRIEF DESCRIPTION OF THE DRAWINGS

The present invention will be more fully appreciated and its attendant advantages and features will be more readily understood with reference to the following detailed description, when read in conjunction with the accompanying drawings, in which.

It is noted that these drawings are provided to illustrate the invention rather than limiting it. It is also noted that any of the drawings that depicts a certain structure is not necessarily drawn to scale. Further, the same or like elements are given the same or similar reference numbers throughout the drawings.

DETAILED DESCRIPTION

In order for the present invention to be more apparent and more easily understood, a detailed description thereof is set forth below with reference particular embodiments and the accompanying drawings.

FIGS. 1 to 5 schematically illustrate steps of a method for local thinning of a top silicon layer of a SOI wafer according to preferred embodiments of the present invention.

As illustrated in FIGS. 1 to 5, the method according to the preferred embodiments of the present invention includes the steps as described below.

Figure 1:
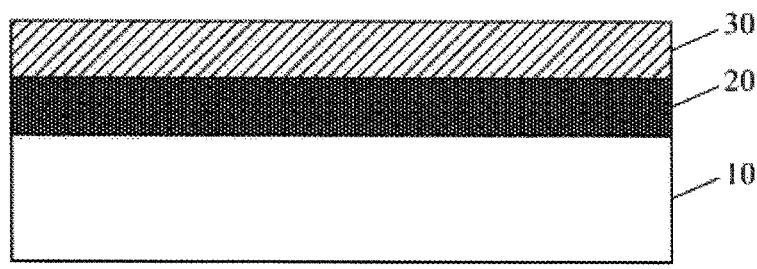
FIGS. 1 to 5 schematically illustrate steps of a method for local thinning of a top silicon layer of a SOI wafer according to preferred embodiments of the present invention.

As shown in FIG. 1, the SOI wafer is provided, wherein the SOI wafer includes sequentially stacked layers which are a bottom silicon layer 10 (acting as a support layer), a buried oxide layer 20 (acting as an insulating layer) and the top silicon layer 30 (acting as an active layer). Electronic circuits may be formed in the top silicon layer 30. In general, the bottom silicon layer 10 may be relatively thick and may mainly function to provide the two overlying layers (i.e., the top silicon layer 30 and the buried oxide layer 20) with a mechanical support. Preferably, the top silicon layer 30 is silicon with a thickness in the range of from 1000 Å to 1450 Å. The buried oxide layer 20 may be a silicon dioxide layer, for example.

Figure 2:
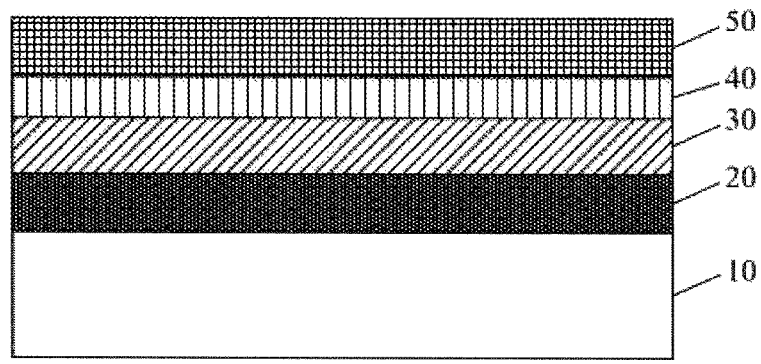

As shown in FIG. 2, a silicon dioxide layer 40 and a polysilicon layer 50 are formed over the top silicon layer 30 in succession. Preferably, the silicon dioxide layer 40 has a thickness of about 100 Å. Preferably, the polysilicon layer 50 is as thick as a thickness to be subsequently reduced by local thinning. Accordingly, the thickness of the polysilicon layer 50 should be smaller than the thickness of the top silicon layer 30. For example, the thickness of the polysilicon layer 50 may be approximately 450 Å.

Figure 3:
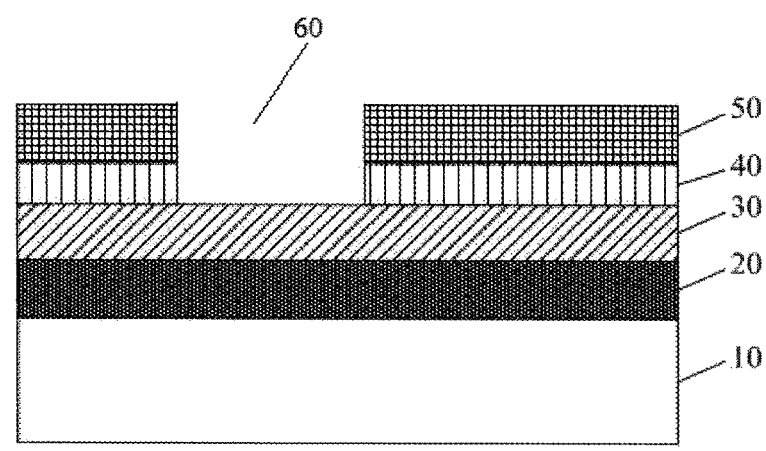

As shown in FIG. 3, the silicon dioxide layer 40 and polysilicon layer 50 are etched such that a pattern 60 that corresponds to an area to be locally thinned is formed in the silicon dioxide layer 40 and the polysilicon layer 50, exposing the surface of the underlying top silicon layer 30.

Figure 4:
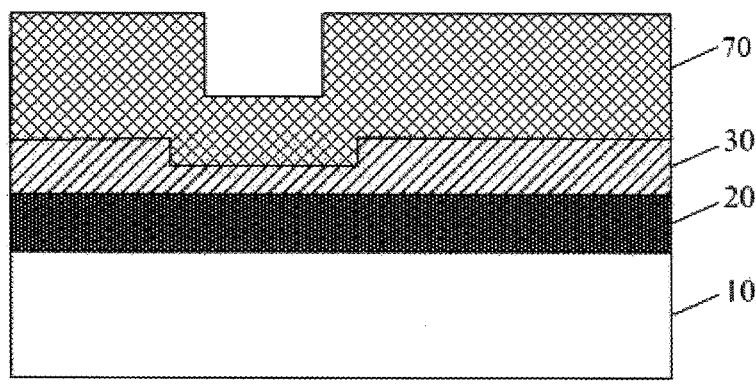

As shown in FIG. 4, an oxidization process is performed to completely oxidize the silicon dioxide layer 40 and the polysilicon layer 50 remaining from the etching step and to concurrently oxidize an area of the top silicon layer 30 that is exposed in the pattern 60, thereby forming a cap oxide layer 70. As used herein, "to completely oxidize" means oxidization of the polysilicon layer 50 throughout its entire thickness. As the top silicon layer 30 and the polysilicon layer 50 are both silicon-based materials, they are oxidized at the substantially same speed, indicating that upon a thickness of h of the polysilicon layer 50 having been oxidized, an oxidized thickness of the area of the top silicon layer 30 that is exposed in the pattern 60 is substantially equal to h. This is the reason why the thickness of the polysilicon layer 50 is preferably selected to be equal to the thickness to be reduced by local thinning. Upon the polysilicon layer 50 having been completely oxidized, a substantially equally thick oxide is formed under the surface of the area of the top silicon layer 30 that is exposed in the pattern 60. As the polysilicon layer 50 and the top silicon layer 30 are oxidized into silicon dioxide which is also the material of the silicon dioxide layer 40, the cap oxide layer 70 is an integral structure. As can be perceived from FIG. 4, in the area to be locally thinned (i.e., the area corresponding to the pattern 60), the cap oxide layer 70 has a thickness that extends downward from the surface of the top silicon layer 30 and is substantially equal to the thickness of the polysilicon layer 50 formed in the previous formation step of the polysilicon layer 50.

Figure 5:
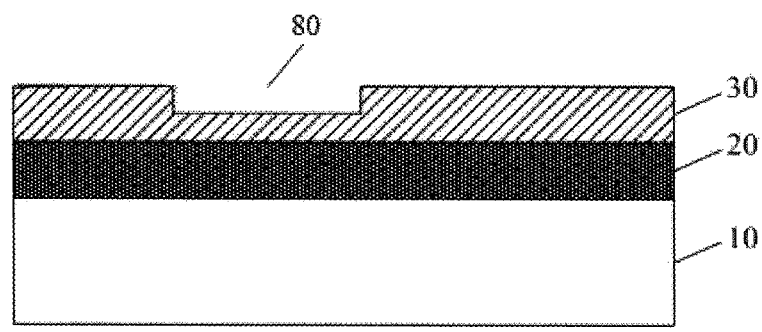

As shown in FIG. 5, the cap oxide layer 70 is removed, such that a locally thinned area 80 is formed in the area of the top silicon layer 30 that corresponds to the aforementioned pattern. The thickness reduced by local thinning is substantially equal to the thickness of the cap oxide layer 70 extending downward from the surface of the top silicon layer 30.

The method according to the preferred embodiments of the present invention is compatible with CMOS and other conventional standard processes. For example, one or more of the formation of the silicon dioxide layer 40 and polysilicon layer 50, the etching of the silicon dioxide layer 40 and polysilicon layer 50, the oxidization and the removal of the cap oxide layer may be accomplished in corresponding steps in a CMOS process. In addition, the processes used in the present invention can form a locally thinned area with a good shape and a controlled thickness.

It is noted that all the thickness values enumerated herein are merely preferred examples for clearly explaining the principles of the present invention. As will be appreciated by any artisan skilled in the art, in practice, the particular values of the thicknesses may be selected according to needs.

Further, it is noted that, unless otherwise specified or indicated, as used herein, the terms "first", "second", "third" and the like are only intended to distinguish between different components, elements, steps, etc. rather than describe any logical or sequential relationship among the components, elements or steps.

It is to be understood that while the present invention has been disclosed above with reference to preferred embodiments, these embodiments are not intended to limit the invention in any way. In light of the above disclosure, any person skilled in the art can make a variety of possible variations and modifications to the subject matter of the invention or change it to equivalent embodiments without departing from the scope of the subject matter of the invention. It is therefore intended that any simple variations, equivalent changes and modifications to the foregoing embodiments based on the essence of the present invention made without departing from the scope of the subject matter of the invention still fall within the scope of protection of the subject matter of the invention.

What is claimed is:

1. A method for local thinning of a top silicon layer of a silicon-on-insulator wafer, comprising the following steps in the sequence set forth:
    providing a silicon-on-insulator wafer, wherein the silicon-on-insulator wafer comprises a bottom silicon layer, a buried oxide layer and a top silicon layer, which are sequentially stacked from the bottom up;
    successively forming a silicon dioxide layer and a polysilicon layer over the top silicon layer;
    etching the silicon dioxide layer and the polysilicon layer until a top surface of a portion of the top silicon layer is exposed, such that a pattern that corresponds to an area to be locally thinned is formed in the silicon dioxide layer and the polysilicon layer;
    oxidizing the silicon dioxide layer and the polysilicon layer remaining from the etching step and concurrently oxidizing the exposed portion of the top silicon layer until the polysilicon layer has been completely converted to an oxide, thereby forming a cap oxide layer jointly constituted by the oxidized polysilicon layer, the silicon dioxide layer and the oxidized portion of the top silicon layer; and
    removing the cap oxide layer, so that a locally thinned area is formed in the top surface of the top silicon layer.

2. The method according to claim 1, wherein the top silicon layer has a thickness of 1000 Å to 1450 Å.

3. The method according to claim 1, wherein the silicon dioxide layer has a thickness of 100 Å.

4. The method according to claim 1, wherein the polysilicon layer has a thickness that is determined by a thickness desired to be reduced by the local thinning.

5. The method according to claim 1, wherein the polysilicon layer has a thickness of 450 Å.

6. The method according to claim 1, wherein the top silicon layer has electronic circuits formed therein.

7. The method according to claim 1, wherein the bottom silicon layer provides the top silicon layer and the buried oxide layer with a mechanical support.

8. The method according to claim 1, wherein the buried oxide layer is a silicon dioxide layer.

9. The method according to claim 1, wherein the polysilicon layer has a thickness smaller than a thickness of the top silicon layer.

* * * * *